United States Patent [19]

Itoh

[11] Patent Number: 4,709,380
[45] Date of Patent: Nov. 24, 1987

[54] BUCKET BRIGADE CHARGE TRANSFER DEVICE WITH AUXILIARY GATE ELECTRODE

[75] Inventor: Minoru Itoh, Nagaokakyo, Japan

[73] Assignee: Matsushita Electronics Corporation, Kadoma, Japan

[21] Appl. No.: 816,956

[22] Filed: Jan. 6, 1986

Related U.S. Application Data

[63] Continuation of Ser. No. 471,725, Mar. 3, 1983, abandoned.

[30] Foreign Application Priority Data

Mar. 9, 1982 [JP] Japan ................................. 57-37769

[51] Int. Cl.[4] .................... G11C 19/28; H01L 29/78
[52] U.S. Cl. ................................. 377/58; 357/24
[58] Field of Search .................... 357/24; 377/57-63

[56] References Cited

U.S. PATENT DOCUMENTS

| | | | |
|---|---|---|---|
| 3,745,383 | 7/1973 | Sangster | 377/57 |
| 3,767,983 | 10/1973 | Berglund | 357/24 |
| 4,157,558 | 6/1979 | Weckler | 357/24 |
| 4,250,517 | 2/1981 | Tseng | 357/24 |

FOREIGN PATENT DOCUMENTS 2508833  9/1975  Fed. Rep. of Germany ........ 357/24

OTHER PUBLICATIONS

Sequin et al., *Charge Transfer Devices*, Academic Press, N.Y. 1975, pp. 30–33.
Barsan et al, "Nonoverlapping Dual-Gate Bucket—Brigade Devices", Appl. Phys. Lett., vol. 36 (15 Feb. 80) pp. 329–331.

*Primary Examiner*—Gene M. Munson
*Attorney, Agent, or Firm*—Cushman, Darby & Cushman

[57] ABSTRACT

A high charge transfer efficiency BBD (bucket brigade device) has an auxiliary gate ($M_{11}$, $M_{12}$...) provided in a position next to each transfer gate (11, 12 ...) of a charge transfer MOSFET, the auxiliary gate being impressed with a DC bias voltage. A region of higher absolute value of threshold voltage at the auxiliary gate electrode is formed, by making the gate insulation film thereat (241, 242 ...) thicker than other parts, or by forming a higher doped island region (211, 212) than the substrate surface under the transfer gate. This enables the attainment of efficient charge transfer by only impressing the same DC bias level on the auxiliary gates ($M_{11}$, $M_{12}$...) as the voltage of the clock signal level for the transfer gates (11, 12 ...).

1 Claim, 9 Drawing Figures

BUCKET BRIGADE CHARGE TRANSFER DEVICE WITH AUXILIARY GATE ELECTRODE

This is a continuation of application Ser. No. 471,725, filed Mar. 3, 1983, which was abandoned upon the filing hereof.

BACKGROUND OF THE INVENTION

1. Field of the Invention

The present invention relates to an improvement in a BBD (bucket brigade device) type charge transfer device.

2. Description of the Prior Art

The most simple prior BBD type charge transfer device is constituted, as shown in the equivalent circuit diagram of FIG. 1, wherein each unit cell comprises charge transfer MOS field effect transistors (hereinafter referred to as MOSFET) 1, 2 or 3 having a capacitance $C_{b1}$, $C_{b2}$ or $C_{b3}$ between the gate and the drain. The unit cells are connected in series, and two-phase clock pulses $\phi_1$ and $\phi_2$ are impressed on the gates of odd order MOSFETs and even order, respectively.

As a BBD, wherein charge transfer efficiency in the low clock frequency region is improved without changing the total channel length of the charge transfer MOSFETs, what is called high transfer efficiency type BBDs having the following two configurations are well known in general.

The first high transfer efficiency BBD, as shown in the equivalent circuit diagram of FIG. 2, besides forming capacitances $C_{b1}$, $C_{b2}$ and $C_{b3}$ between the gate and the drain of the charge transfer MOSFETs 1, 2 and 3, respectively, comprises a DC bias $V_{GG}$ impressed between the drain and the source of neighboring MOSFETs 1 and 2 or 2 and 3, through auxiliary MOSFETs $M_1$, $M_2$, ... the gate of which is impressed with the DC bias $V_{GG}$. The second high transfer efficiency BBD has the equivalent circuit diagram of FIG. 3 when the charge transfer MOSFETs 1, 2 and 3 are made in a two-gate construction, the first gate and the second gate are formed by the superposing of polycrystalline silicon film(s) or shadow etching of an aluminum electrode, thereby forming a capacitance $C_{b1}$ between the first gate $G_1$ (which is a charge transfer gate) neighboring the next drain and the said next drain. Therefore the drain and the source of the MOSFETs are connected in series. DC bias $V_{GG}$ is impressed on the second gate $G_2$ (which is an auxiliary gate) neighboring to the source.

In the above-mentioned two types of high charge transfer efficiency type BBDs, the charge transfer efficiency is greatly improved in comparison with the conventional simple BBD such as shown in FIG. 1, but another driving power source $V_{GG}$ becomes necessary in the circuits of FIG. 2 and FIG. 3.

The reason that the conventional high charge transfer efficiency type BBD requires such a driving power source $V_{GG}$ is elucidated in detail taking a P-channel MOS type BBD as one example.

In the first conventional type high charge transfer efficiency type BBD, each MOSFET must be in the saturation state at the time of each finishing of the charge transfer. FIG. 4 is a schematic potential diagram for optimum operation of the BBD of FIG. 2, showing node potentials at the finishing of charge transfer, and the positions a, b, c, d, e, f, g, h, i and j respectively correspond to the points designated by the same marks in FIG. 2. As is shown in FIG. 4, the potential of the part under the MOSFET $M_1$ is higher than that of the part under the MOSFET 2, and therefore the charge transfer is made efficiently. Transfer inefficiency $R_i$ is given by $$R_i = \beta^2 + \frac{C_s}{C_b} \times \beta, \quad (1)$$

where
$C_b$ is the capacitance value of capacitance $C_{b1}$, $C_{b2}$ and $C_{b3}$,
$C_s$ is the stray capacitance value of the diffusion area between the MOSFET 1 and MOSFET 2, and
$\beta$ is the transfer inefficiency in each MOSFET $M_1$ and MOSFET 2.

The transfer inefficiency $R_i$ is given as a sum of (i) transfer inefficiency due to remaining of the transfer charge in the capacitance $C_b$ (representative of $C_{b1}$, $C_{b2}$ ... ) given by $$\frac{C_b}{C_b} \beta^2 = \beta^2.$$

and (ii) transfer inefficiency due to remaining of the transfer charge in the stray capacitance $C_s$ given by $$\frac{C_s}{C_b} \beta.$$

FIG. 5 is a schematic potential diagram similar to the diagram of FIG. 4, for non-optimum operation of the BBD of FIG. 2, showing each anode potentials at the finish of charge transfer. In this case, as is well known, the incomplete ratio is $\beta$. This means that, this case is equivalent to that where the potentials under the MOSFETs $M_1$ and 2 are the same or where there is no MOSFET $M_1$ provided. Accordingly, when the MOSFETs $M_1$, $M_2$ ..., impressed with a DC bias at the gates, and the other MOSFETs 1, 2, 3 ..., impressed with the clock pulse at the gates, are formed so as to have the same characteristics, then the gate bias voltage $V_{GG}$ impressed on the MOSFETs $M_1$, $M_2$ ... must be smaller than the gate voltage $V_{CPL}$ of the MOSFETs 1, 2, 3 ..., in order to attain improvement of the transfer efficiency. (in this case, since $V_{CPL}$ is a negative voltage, the actual relation must be $|V_{GG}| < |V_{CPL}|$.) In ordinary cases, the optimum condition is that $|V_{GG}|$ is almost equal to $$\frac{14}{15} |V_{CPL}|.$$

FIG. 6 shows the measured relations between values of the transfer efficiency and $V_{GG}$ of a P-channel type BBD under the condition that:
power source voltage ... $-15$ V
clock pulse low level voltage ... $-15$ V
clock pulse high level voltage ... $0$ V
clock frequencies ... 40 KHz, 100 KHz and 200 KHz.

As is induced from the relations of FIG. 6, the secondary power source for $|V_{GG}|$ is needed besides the power source for the clock pulse $|V_{CPL}|$, and the former must be lower than the latter, in order to retain high transfer efficiency.

The same elucidation as above applies to the improved conventional circuit of FIG. 3.

SUMMARY OF THE INVENTION

The present invention is intended to solve the above-mentioned problem, and provides an improved BBD operable with a single power source.

The BBD of the present invention comprises series-connected plural unit cells each having a charge transfer gate (11, 12 . . . ) to be impressed with clock pulses at its gate, an auxiliary gate ($M_{11}$, $M_{12}$ . . . ) to be impressed with DC bias and disposed between two neighboring charge transfer gates (11, 12 . . . ), a region of higher absolute value of threshold voltage formed at part of the auxiliary gate ($M_{11}$, $M_{12}$ . . . ), the region of higher absolute value of threshold voltage being formed by partly thickening the gate oxide film at the auxiliary gate ($M_{11}$, $M_{12}$ . . . ) or by making the surface impurity concentration at the part under the auxiliary gate ($M_{11}$, $M_{12}$ . . . ) higher than that of the part under the charge transfer gate (11, 12 . . . ).

As a result of the above-mentioned configuration, the transfer efficiency for the low clock frequency range can be made optimum even when the bias voltage ($V_{GG}$) is equal to the clock pulse voltage ($V_{CPL}$).

In other words, the present invention can provide a charge transfer device of very high transfer efficiency without the use of particular DC bias power source.

The configuration of the present invention is based on the fact that the surface potential under the gate varies by changing the gate oxide film thickness or changing the surface impurity concentration under the gate. That is, the surface potential becomes shallower, hence the absolute value of the gate threshold voltage increases, as the surface impurity concentration is higher or as the gate oxide film is thicker.

DESCRIPTION OF THE PREFERRED EMBODIMENTS

Figure 1:
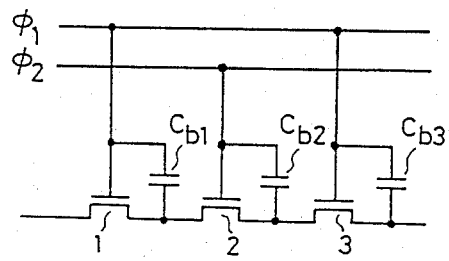
FIG. 1 is the equivalent circuit of the conventional BBD of simplest configuration.
Figure 2:
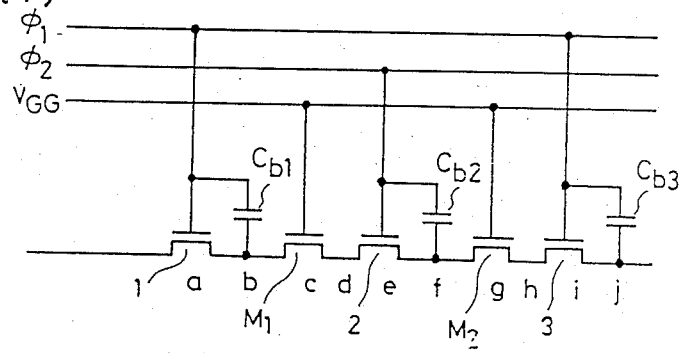
FIG. 2 is the equivalent circuit of the first type conventional high transfer efficiency BBD.
Figure 7:
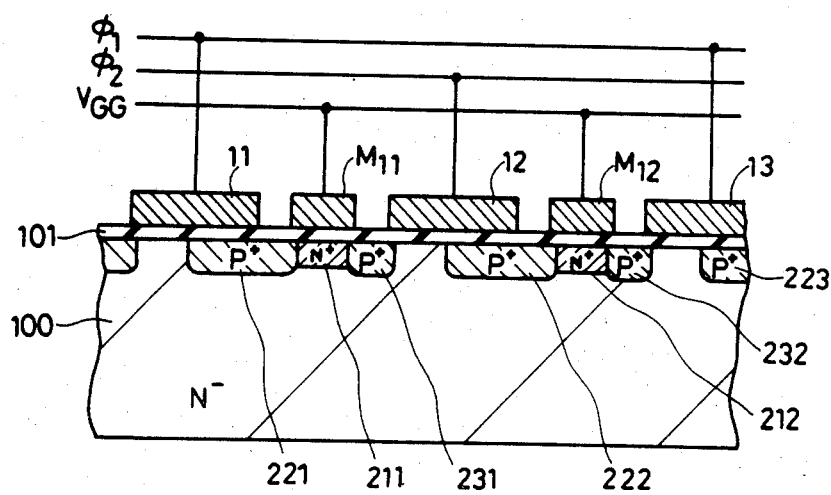
FIG. 7 is a sectional view showing the configuration of a first example of a BBD embodying the present invention.

FIG. 7 shows a sectional configuration of a first example of a BBD embodying the present invention. In the figure, gates 11, 12, 13 . . . are main gates of charge transfer MOSFETs and are to be impressed with clock pulse voltage $\phi_1$, $\phi_2$, $\phi_1$ . . . respectively. $N^+$-type channel regions 211, 212 . . . are disposed under auxiliary gates ($M_{11}$, $M_{12}$ . . . ) of course in a substrate 100 with a gate oxide film 101 inbetween. Source regions and drain regions 221, 222, 223 . . . , 231, 232 . . . are formed on the upstream side and down stream side of the channel region 211, 212 . . . , respectively. The configuration corresponds to the equivalent circuit of FIG. 2. In other words, each unit cell is formed as a dual gate structure MOSFET defined by a pair of the source/drain electrode 221-222, 222-223 or . . . , an $N^+$-type channel region 211 and a $P^+$-type island region disposed between the pair of the source/drain electrode. The region between the sorce/drain electrodes 221-222, 222-223, etc. is herein termed the charge transfer region. Doping for forming the $N^+$-type channel region 211 is made, for instance by ion-implantation, in a manner to make the surface impurity concentration to be higher than the surface impurity concentration of the $N^-$-type region under the main gates 11, 12 . . . of the transfer MOSFETs, thereby forming a region of higher absolute value of gate threshold voltage at the part of each auxiliary gate. This doping can be made without increasing the particular steps by utilizing a doping process for producing a channel stopper to isolate the transistors.

Figure 3:
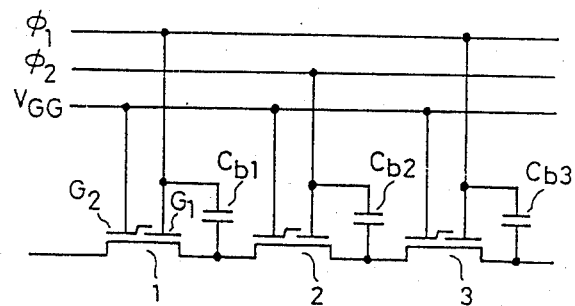
FIG. 3 is the equivalent circuit of the second type conventional high transfer efficiency BBD.
Figure 4:
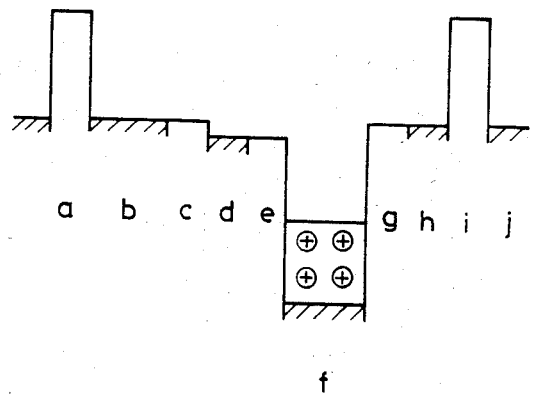
FIG. 4 is the potential diagram of respective nodes at the time of the finish of transfer at the optimum operation of the first type high transfer efficiency BBD.
Figure 5:
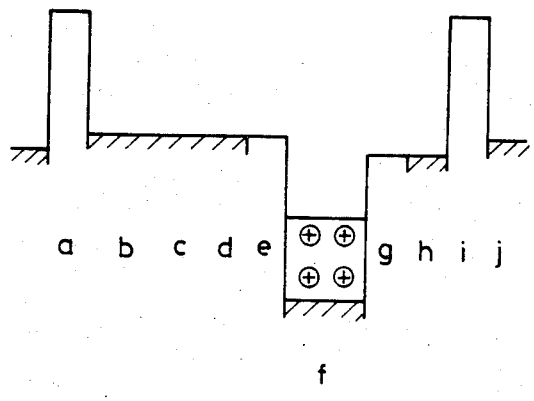
FIG. 5 is the potential diagram of respective nodes at the time of the finish of transfer at the non-optimum operation of the first type high transfer efficiency BBD.
Figure 6:
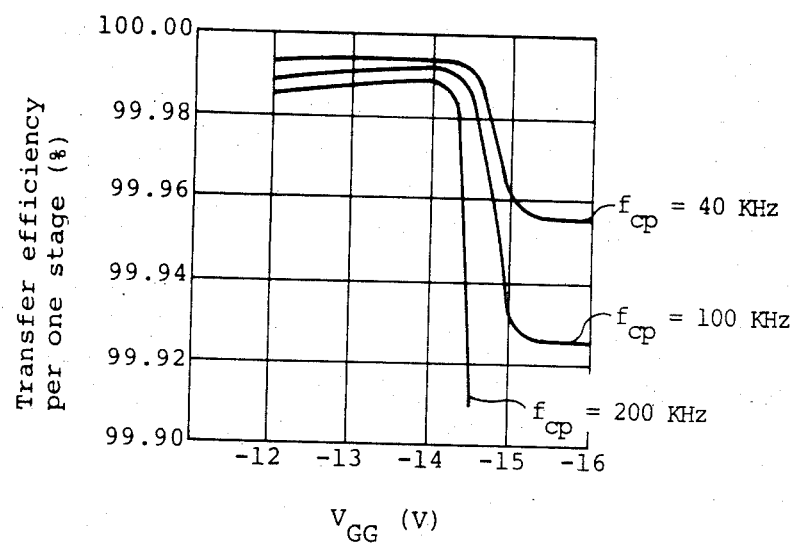
FIG. 6 is the graph showing the $V_{GG}$-dependency characteristic of transfer efficiency of the first high transfer efficiency type p-channel BBD.
Figure 8:
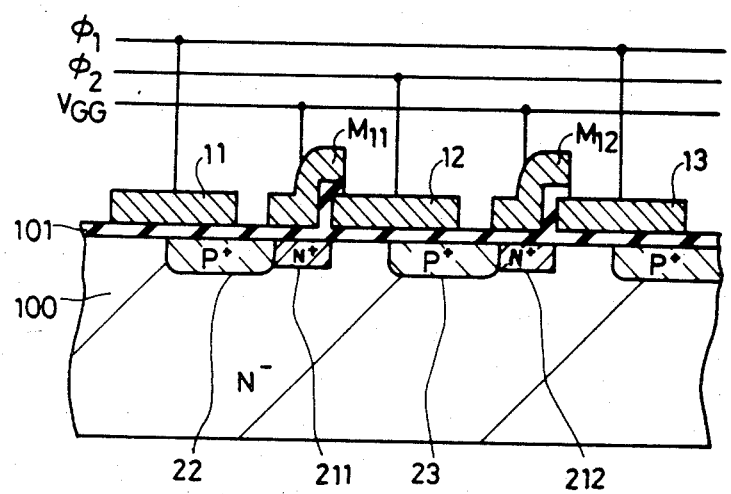
FIG. 8 is a sectional view showing the configuration of a second example of a BBD embodying the present invention.

FIG. 8 shows a sectional configuration of another example employing the dual-gate structure MOSFETs. The same numerals as in the example of FIG. 7 designates corresponding parts, and accordingly the same explanations apply. This configuration corresponds to the equivalent circuit of FIG. 3, and this example differs from that of FIG. 7 in the omission of the $P^+$-type island regions 231, 232 . . . in the charge transfer region of the unit cells. In the example of FIG. 8, an $N^+$-type doped region 211 or 212 or . . . are formed under the auxiliary gate in the substrate like in the example of FIG. 7, thereby forming a region of higher absolute value of gate threshold voltage at the part of each auxiliary gate.

Figure 9:
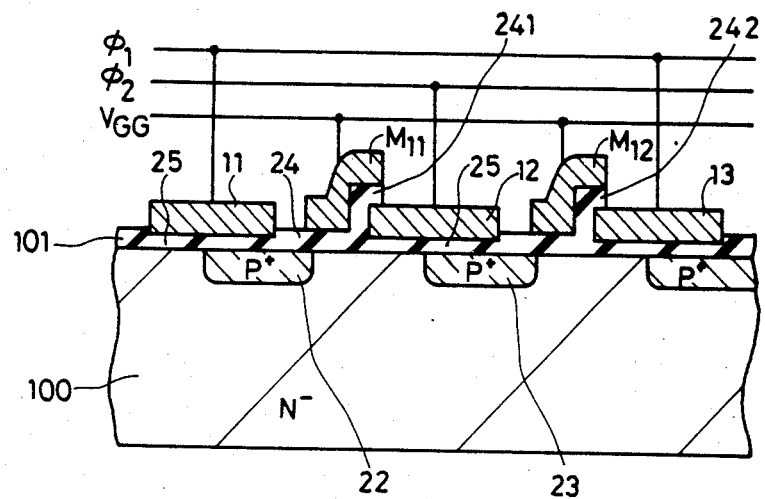
FIG. 9 is a sectional view showing the configuration of a third example of a BBD embodying the present invention.

FIG. 9 shows a sectional configuration of another example embodying the dual-gate structure MOSFETs. The same numerals as the example of FIG. 7 designates corresponding parts, and accordingly the same explanations apply. This configuration corresponds to the equivalent circuit of FIG. 3, and this example differs from that of FIG. 7 in the omission of the $P^+$-type island regions 231, 232 . . . and $N^+$-type channel regions 211, 212 . . . in the charge transfer region of the unit cell. However, in the example of FIG. 9, the gate oxide films 241, 242 . . . under the auxiliary gate $M_{11}$, $M_{12}$ . . . are made thicker than that under the gate oxide films 25, 25 under the main gates 11, 12 . . . , thereby forming a region of higher absolute value of gate threshold voltage at the part of each auxiliary gate.

In this example, interlayer insulation is also improved by making the gate oxide films 241, 242 under the gates $M_{11}$, $M_{12}$ . . . , and over the charge transfer region, thick.

Though the above-mentioned examples are elucidated with respect to P-channel BBD, the present invention is also applicable to the N-channel BBD without any particular inventive step.

Since the high transfer efficiency BBD in accordance with the present invention can be made by only changing some part of the manufacturing condition or mask-pattern to be used in manufacturing and achieves the great advantage of simplification of the power source, it is practically and industrially very useful in achieving high performance without increasing process steps and external components and power consumption, and can further achieve economical utility and reliability.

What is claimed is:

1. A charge transfer device having a plurality of series-connected unit cells each comprising:
   a substrate formed of a first conductivity type;
   a plurality of source/drain regions formed on the surface of said substrate and having a second conductivity type, said source/drain regions being spaced with respect to one another;
   a charge transfer region between said source/drain regions, which is formed by making the surface impurity concentration under said auxiliary gate electrode higher than that under said gate electrodes;
   a plurality of gate electrodes each individually aligned with one of said source/drain regions such that each of said gate electrodes extend partially over said charge transfer regions between a pair of source/drain regions and partially over an associated one of said source/drain regions;
   at least one auxiliary gate electrode aligned over the charge transfer region between said source/drain regions, said auxiliary gate electrode being impressed with a DC bias voltage;
   a partially thickened oxide insulative film at said auxiliary gate electrode such that said oxide insulative film is thicker at said auxiliary gate electrode than the gate oxide film under the gate electrodes;
   a single voltage source for generating said clock pulses and said DC bias voltage; and
   means for forming said charge transfer region with a higher absolute value of threshold voltage than that of said source/drain regions.

* * * * *